United States Patent
West et al.

(10) Patent No.: US 8,344,493 B2
(45) Date of Patent: Jan. 1, 2013

(54) WARPAGE CONTROL FEATURES ON THE BOTTOMSIDE OF TSV DIE LATERAL TO PROTRUDING BOTTOMSIDE TIPS

(75) Inventors: Jeffrey Alan West, Dallas, TX (US); Jeffrey E. Brighton, Frisco, TX (US); Margaret Simmons-Matthews, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/985,823

(22) Filed: Jan. 6, 2011

(65) Prior Publication Data
US 2012/0175774 A1 Jul. 12, 2012

(51) Int. Cl.
*H01L 23/532* (2006.01)
*H01L 21/50* (2006.01)
*H01L 21/768* (2006.01)

(52) U.S. Cl. ........ 257/686; 257/621; 257/774; 257/777; 257/E23.169; 257/E23.174; 257/E23.194

(58) Field of Classification Search .................. 257/621, 257/686, 774, 777, E23.169, E23.174, E23.194
See application file for complete search history.

(56) References Cited

U.S. PATENT DOCUMENTS

| | | | | |
|---|---|---|---|---|
| 5,399,898 A | * | 3/1995 | Rostoker | 257/499 |
| 2002/0132463 A1 | * | 9/2002 | Urushima | 438/613 |
| 2003/0210534 A1 | * | 11/2003 | Swan et al. | 361/807 |
| 2004/0192033 A1 | * | 9/2004 | Hara | 438/667 |
| 2010/0171226 A1 | | 7/2010 | West et al. | |

* cited by examiner

*Primary Examiner* — Eugene Lee
*Assistant Examiner* — Peniel M Gumedzoe
(74) *Attorney, Agent, or Firm* — Steven A. Shaw; W. James Brady; Frederick J. Telecky, Jr.

(57) ABSTRACT

A through substrate via (TSV) die includes a substrate including a topside semiconductor surface having active circuitry. The die includes a plurality of TSVs that each include an inner metal core that extend from the topside semiconductor surface to protruding TSV tips that extend out from the bottomside surface. A metal cap is on the protruding TSV tips that includes at least one metal layer that has a metal that is not in the inner metal core. A plurality of protruding warpage control features are on the bottomside surface lateral to the protruding TSV tips, wherein the plurality of protruding warpage control features do not have the protruding TSV tips thereunder. The plurality of protruding warpage control features can include the same metal layer(s) used for the metal cap.

11 Claims, 8 Drawing Sheets

WARPAGE CONTROL FEATURES ON THE BOTTOMSIDE OF TSV DIE LATERAL TO PROTRUDING BOTTOMSIDE TIPS

FIELD

Disclosed embodiments relate to electronic devices, and more particularly to assembly of integrated circuit (IC) die or a wafer comprising a plurality of ICs having protruding through substrate via tips to at least one workpiece, and electronic devices therefrom.

BACKGROUND

As known in the art, through-substrate vias (referred to herein as TSVs), which are commonly referred to as through-silicon vias in the case of silicon substrates, are vertical electrical connections that extend the full thickness of the IC die from one of the electrically conductive levels formed on the topside semiconductor surface of the IC die (e.g., contact level or one of the BEOL metal interconnect levels) to its bottomside surface. Such IC die are referred to herein as "TSV die." The vertical electrical paths are significantly shortened relative to conventional wire bonding technology, generally leading to significantly faster device operation. In one arrangement, the TSVs terminate on the bottomside of the TSV die as protruding TSV tips, such as protruding a distance of 5 to 15 μms from the bottomside substrate (e.g., silicon) surface. To form the protruding tips, the TSV die are commonly thinned to expose the TSVs and to form the tips, such as to a die thickness of 25 to 100 μm, using a process generally including backgrinding. The TSV die can be bonded face-up or face-down, and can be bonded to from both of its sides to enable formation of stacked die devices.

In die areas having TSVs, there can be no active devices because TSVs extend the full thickness of the TSV die. TSVs on the TSV die are generally arranged in a plurality of separate TSV arrays that cover a relatively small percentage of the TSV die area, and thus TSVs collectively do not approach uniformly covering the area of the TSV die. The TSVs within the TSV arrays are typically regularly spaced having a fixed pitch. Regions beyond the TSV arrays (referred to herein as "gap regions") result in an irregular bottomside topography caused by the protruding TSV tips being elevated, with the gap regions having a consistent lowest elevation. The TSV tips may include a metal cap thereon, such as a cap including a nickel layer, that can function as an inter-metallic compound (IMC) barrier to overlying Sn-based solder in the case of solder mediated joints to a workpiece (e.g., a package substrate or another die or a die stack) to avoid, or at least delay, the consumption of the inner metal core (e.g., copper) of the TSV from forming an IMC which can lead to cracking of the outer dielectric sleeve of the TSV, and resulting failures (e.g., leakage or shorts) on the TSV die. The metal cap can significantly increase the height of the TSV tips relative to the gap regions.

Thermo-compression (TC) bonding is a common IC assembly method that involves the use of pressure applied by a bond head and a significant temperature (e.g., a temperature high enough to melt solder, such as 250 to 350° C.) to join two materials by interdiffusion across the boundary of the materials. The bonding process relies on pressure to push pillars or other bonding features on the topside semiconductor surface of TSV die or a TSV wafer against opposing pads on a substrate or another die that are to be bonded, and to heat and melt the solder. During TC bonding of a thin (e.g., <100 μm thick) TSV die having bottomside TSV tips to a substrate (e.g., package substrate, die, or die stack) in which the topside of the TSV die is bonded to pads on a substrate, the TC bond head comes in direct contact with the bottomside of the TSV die that has the above-described TSV tip-induced irregular topography.

SUMMARY

Disclosed embodiments are based on several recognitions of happenings during TC bonding the topside semiconductor surface (active side) of thin TSV die or thin TSV wafers (e.g., <100 μm thick) to a workpiece, where the TSV die or TSV wafers have gap regions across their area. The gap regions have a consistent lowest elevation relative to protruding TSV tips resulting in an irregular bottomside topography than can cause pick-up problems and substantially non-uniformly distributed pressure applied during bonding.

Regarding pick-up problems, the exposed TSVs on the bottomside of the TSV die or TSV wafer can be damaged during vacuum pick-up, which can lead to poor bond integrity during subsequent bonding of the TSV tip to another workpiece. Moreover, thin TSV die and TSV wafers can easily bend when subjected to non-uniformly distributed pressure during bonding. This can lead to intra-die warpage post-bonding that induces non-uniform tensile stresses on the topside bonds which has been found by the Inventors to cause low bond yield to a workpiece, such as an organic substrate, and can also result in degradation of the "co-planarity" of the protruding TSVs that can create problems for subsequent bonding of the collective TSV tips to a workpiece with a nominally co-planar bonding surface.

Disclosed embodiments solve the above-described warpage problem by adding a plurality of protruding warpage control features lateral to the TSV tips to populate the gap regions on the bottomside of the TSV die to minimize the area of the gap regions on the bottomside of the TSV die, which results in a more uniform pressure applied by the TC bond head during TC bonding. Such warpage control features have been found to eliminate or at least significantly reduce TC-bonding induced opens on the bonded topside of the TSV die, and subsequently bonded devices to the bottomside of the TSV die. Disclosed warpage control features provide no electrical function. Since disclosed protruding warpage control features only extend out from the bottomside of the die, no active die area is lost since active circuitry can be placed on the topside surface of the TSV die directly above the above warpage control features. Disclosed protruding warpage control features may be contrasted to dummy (non-electrically connected) TSVs which may also improve the uniformity of distributed pressure during TC bonding, but have the limitation that they necessarily sacrifice active die area.

BRIEF DESCRIPTION OF THE DRAWINGS

FIG. 3A shows features on an example mask layout for a TSV die for a conventional metal cap mask that positions metal caps over TSV tips, while

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1A:
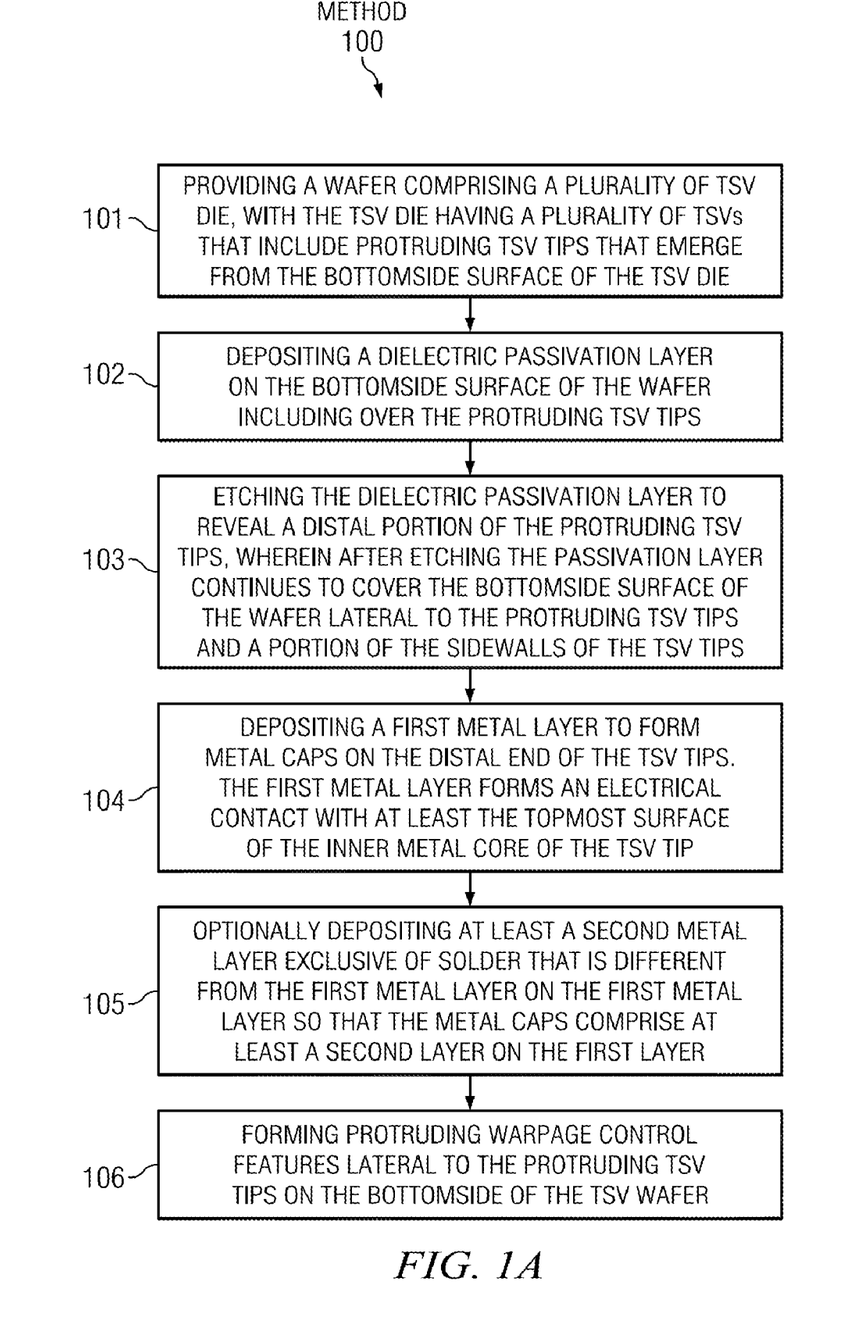
FIG. 1A is a flow chart that shows steps in an example method of forming a TSV wafer comprising a plurality of TSV die having protruding TSV tips with metal caps thereon comprising at least one metal layer thereon, and protruding warpage control features lateral to the protruding TSV tips on the bottomside of the TSV die, according to an example embodiment.

FIG. 1A is a flow chart that shows steps in an example method 100 of forming a TSV wafer comprising a plurality of TSV die having protruding TSV tips with metal caps comprising at least one metal layer thereon, and protruding warpage controlling features lateral to the protruding TSV tips on the bottomside surface of the TSV die, according to an example embodiment. Step 101 comprises providing a wafer comprising a plurality of TSV die. The TSV die includes at least one, and generally a plurality of TSVs, that comprise an inner metal core and an outer dielectric sleeve that extends the full thickness of the die from the topside semiconductor surface (generally coupled to the contact level or one of the BEOL metal layers (e.g., M1, M2, etc.) to protruding TSV tips that emerge from the bottomside surface of the TSV die.

In one embodiment a length of the protruding TSV tips measured from the bottomside surface of the die is from 5 to 15 µm. In this embodiment, a top surface of the metal caps on the protruding TSV tips is no more than 4 µm above a height of a top surface of the plurality of protruding warpage control features. In one embodiment the TSV diameter is <12 µm, such as 6 to 10 µm in one particular embodiment.

The inner metal core can comprise Cu in one embodiment. Other electrically conductive materials can be used for the inner metal core. The outer dielectric sleeve can comprise materials such as silicon oxide, silicon nitride, phosphorus-doped silicate glass (PSG), silicon oxynitride, or certain CVD polymers (e.g., parylene). The outer dielectric sleeve is typically 0.2 to 5 µm thick. In the case of copper and certain other metals for the inner metal core, a metal diffusion barrier layer referred to herein as a "TSV barrier" is generally added, such as a refractory metal or a refractory metal nitride. For example, TSV barrier materials can include materials including Ta, W, Mo, Ti, TiW, TiN, TaN, WN, TiSiN or TaSiN, which can be deposited by physical vapor deposition (PVD) or chemical vapor deposition (CVD). The TSV barrier is typically 100-500 Å thick. The distal portion of the TSV tip includes an exposed (i.e., dielectric sleeve free) area that at least exposes the topmost surface of the inner metal core to allow electrical contact thereto.

Step 102 comprises depositing a dielectric passivation layer on the bottomside surface of the wafer including over the protruding TSV tips. The dielectric passivation layer can comprise a polymer. In another embodiment, the dielectric passivation layer can comprise an inorganic oxide, nitride or oxynitride, or combination thereof. In one embodiment the dielectric passivation layer is deposited using a spin-on process. However, other deposition processes may be used. In the case of spin-on organic passivation, the deposited thickness of the dielectric passivation layer is typically slightly thicker (1-5 µm) than the TSV tip protrusion height. In the case of inorganic layers, the deposited thickness is generally less than that of the TSV protrusion height.

Step 103 comprises etching the dielectric passivation layer to reveal a distal portion of the protruding TSV tips, including exposing a portion of the inner metal core, wherein after etching generally at least 1 µm of the passivation layer continues to cover the bottomside surface of the wafer lateral to the protruding TSV tips and a portion of the sidewalls of the TSV tips. Dry etching can be used for this step. Wet etch processing may also be suitable. For example, one exemplary wet etch process coats the TSV tips with a dielectric polymer that encapsulates the TSV tips, and then a portion of the dielectric polymer is removed from the TSV tips using a solvent to expose a distal tip portion of the TSV tips to permit electrical connection thereto.

In one embodiment step 102 can comprise chemical vapor deposition (CVD) of a dielectric passivation layer comprising silicon nitride or silicon oxynitride, and step 103 can comprise chemical mechanical polishing (CMP) to reveal a distal portion of the protruding TSV tips including exposing a portion of the inner metal core.

Step 104 comprises depositing a first metal layer to form metal caps on the distal end of the TSV tips. For example, a first metal layer exclusive of solder can be electrolessly or electrolytically deposited (i.e., electroplating) on a distal portion of the protruding TSV tips. The first metal layer forms an electrical contact with at least the topmost surface of the inner metal core of the TSV tip. The first metal layer is generally 1 to 4 µm thick. The first metal layer can provide both an IMC block and current spreader function for the TSV tip. The first metal layer can comprise materials including Ni, Pd, Co, Cr, Rh, NiP, NiB, CoWP or CoP, for example. In one specific embodiment, the first metal layer can comprise a 3 to 8 µm thick electroplated Cu plated layer. An optional metal barrier layer may also be included between the first metal layer and the distal portion of the TSV tips. For example, a Ti or Ta comprising layer of about 1 kÅ to 3 kÅ may be used as a barrier layer.

As known in the art of plating, electroless plating is a selective deposition process that only deposits on certain exposed metal or semiconductor surfaces, not on dielectrics such as polymers, oxides and nitrides, and thus does not involve lithography to generate a pattern or an etching step to remove the excess deposited material. In another embodiment, electroplating can be used by building a patterned layer using lithography so that an electroplated pad can be created over the TSV tip to localize the deposition to the tip region using an electroplating process. In one particular embodiment, step 104 can comprise sputtering a bilayer barrier layer and seed layer, such as a Ti barrier and Cu seed, and then patterning the bilayer to form metal caps on the distal end of the TSV tips.

Step 105 comprises optionally depositing at least a second metal layer exclusive of solder that is different from the first metal layer on the first metal layer so that the metal caps comprise at least a second metal layer on the first metal layer. As with step 104 described above, the plating can comprise electroplating or electroless plating. The combined thickness of the first and second metal layers can be 1 to 10 μm.

In a first particular embodiment, the metal stack can comprise a barrier layer, followed by first through fourth metal layers comprising Cu, Ni, Pd, then Au. In another particular embodiment, a barrier layer is followed by a first metal layer comprising Ni and the second metal layer comprising Cu, Pt, Pd or Au. For example, the Ni first layer can be 1 to 4 μm thick, and the second metal layer can comprise 2 to 5 μm thick Cu. Ni provides an IMC block, while the second metal embodied as a Cu layer both contributes to subsequent conversion of the solder into a $Cu_xSn_y$ IMC and delays the full conversion of Ni in the first metal layer to IMC, thereby extending the electromigration (EM) capability for the TSV.

Step 106 comprises forming protruding warpage control features lateral to the protruding TSV tips on the bottomside of the TSV wafer. As described above, disclosed protruding warpage control features provide no electrical function. The protruding warpage control features are formed on the bottomside dielectric passivation layer. The protruding warpage control features can comprise a dielectric, semiconductor, a metal, or any combination of these (e.g., multi-layer stack). Warpage control features can be formed using a variety of processes, including lamination and various deposition processes, such as various vapor depositions, and electroplating or electroless plating.

The height of the protruding warpage control features is generally selected so that the top of the protruding warpage control features is within 4 μm of the top of the metal caps on the TSV tips. The area geometry (shape) of the warpage control features can be the same as the metal caps over the TSV tips (octagonal, square, or rectangular), or can be other geometries including high aspect ratio rectangles ("lines"), an elliptical geometry including a circular geometry, or other shapes, such as shapes that enhance heat transfer from the bottomside of the TSV die by providing significant lateral heat spreading.

Figure 1B:
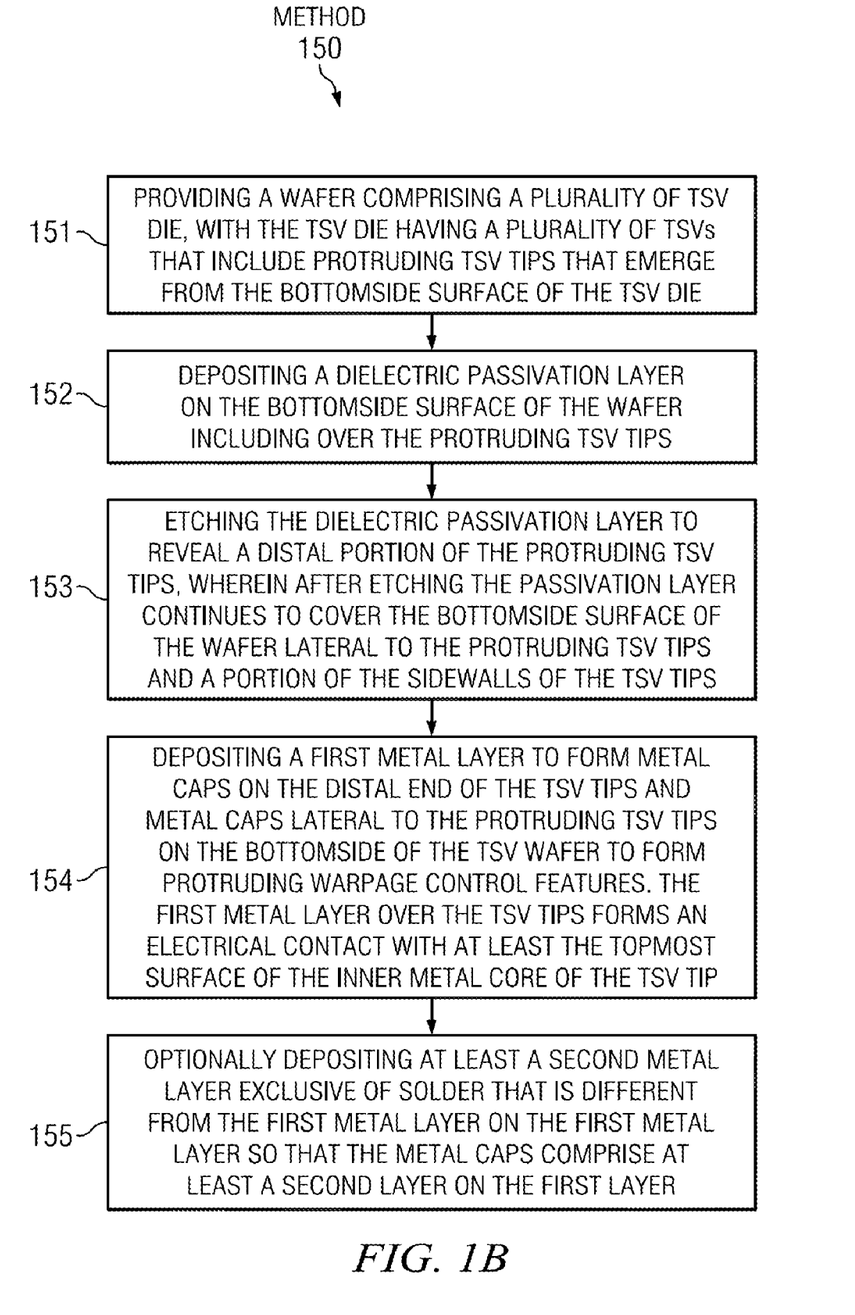
FIG. 1B is a flow chart that shows steps in an example method of forming a TSV wafer comprising a plurality of TSV die having protruding TSV tips with metal caps comprising at least one metal layer thereon and protruding warpage control features comprising the metal layer of the metal cap lateral to the protruding TSV tips on the bottomside of the TSV die, according to an example embodiment.

FIG. 1B is a flow chart that shows steps in an example method 150 of forming a TSV wafer comprising a plurality of TSV die having protruding TSV tips with metal caps comprising at least one metal layer thereon and protruding warpage controlling features comprising the metal layer(s) of the metal cap lateral to the protruding TSV tips on the bottomside of the TSV die, according to an example embodiment. Method 150 includes steps 101-104 and optionally step 105 described above relative to method 100, with steps 104 and 105 modified to form the layers of the metal cap lateral to the TSV tips, with the respective steps renumbered as steps 151-155, respectively.

As described above relative to method 100, step 104 and optional step 105 forms the metal caps on the TSV tips. However, in method 150, step 106 in method 100 which comprises forming the protruding warpage controlling features lateral to the protruding TSV tips on the bottomside of the TSV wafer is instead implemented during earlier processing, specifically in step 154 (depositing a first metal layer to form metal caps on the distal end of the TSV tips) and optionally also during step 155 (depositing at least a second metal layer exclusive of solder that is different from the first metal layer on the first metal layer). In this embodiment, the protruding warpage controlling features comprise the same metal layer(s) of the metal cap on the TSV tips, which can thus be formed using the same mask and the same metal layers used to form the metal cap on the TSV tips. In the case of electroplating to form the metal layers (step 154 and optional step 155) for the metal cap, method 150 implements the protruding warpage controlling features with only a simple mask change to populate the gap regions on the TSV die with protruding warpage controlling features comprising the metal layer(s) of the metal cap lateral, thus not adding any cost or cycle time to the fabrication process. As noted above, the geometry of the warpage control features can be the same or different as compared to the geometry of the metal caps on the TSV tips.

In method 150 the dielectric passivation layer that is lateral to the TSV tips reduces the height difference between the metal capped TSVs and the protruding warpage controlling features that comprise the layers of the metal cap on the passivation layer. In one embodiment, the metal capped TSVs are no more than 4 μm taller than the protruding warpage controlling features that comprise the layers of the metal cap because at the start of the metal deposition process(es) to form the metal caps, the TSV tips may only stick up about 3 μm above the dielectric passivation layer.

Figure 2A:
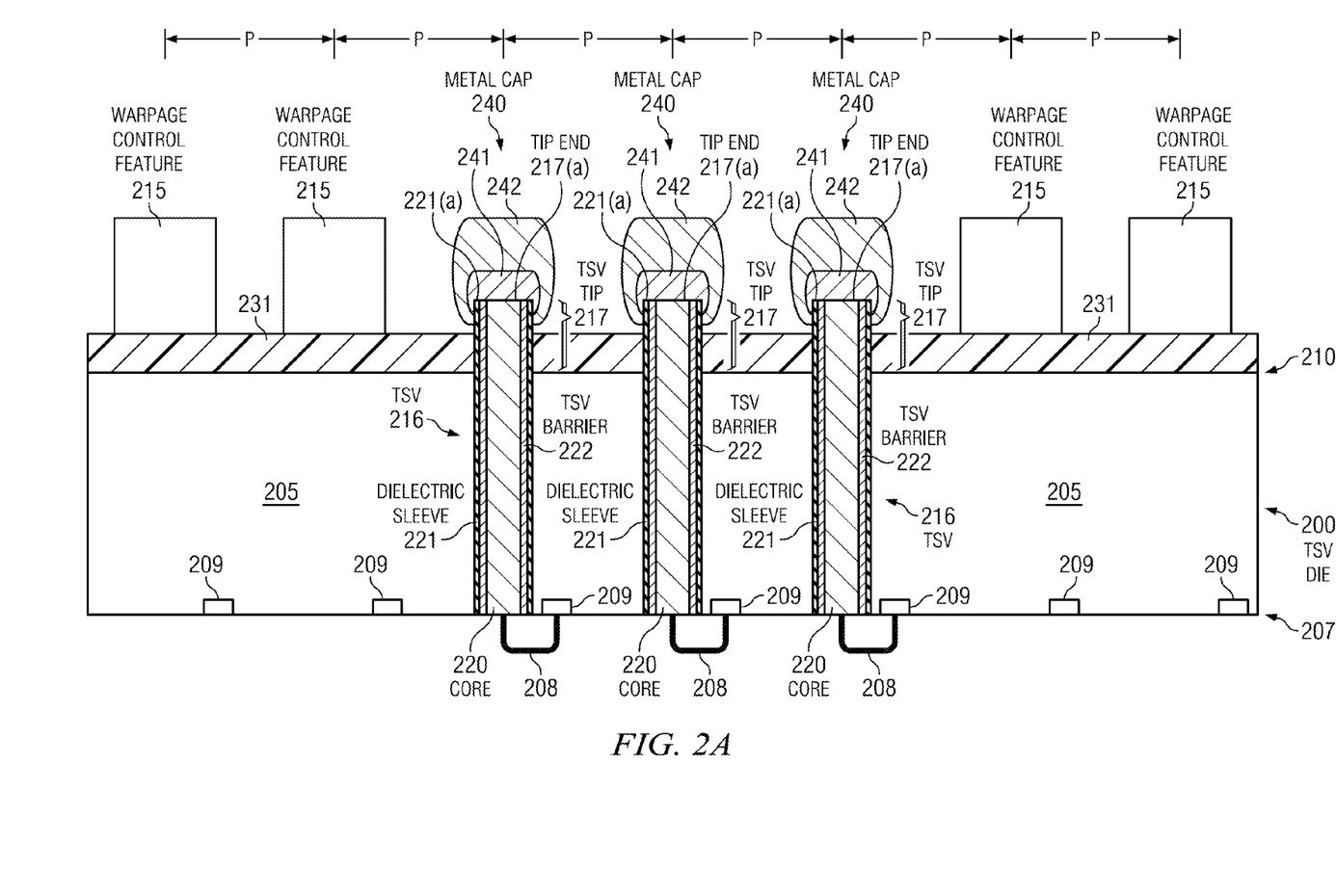
FIG. 2A is a simplified cross sectional depiction of a TSV die comprising a plurality of TSVs that include a protruding TSV tip having a metal cap on the distal tip end, and protruding warpage control features lateral to the TSV tips, according to an example embodiment.

FIG. 2A is a simplified cross sectional depiction of a TSV die 200 comprising a plurality of TSVs 216 that include protruding TSV tips 217 having a metal cap 240 on the distal tip end 217(a), and protruding warpage control features 215 lateral to the TSV tips 217, according to an example embodiment. Although the warpage control features 215 are shown both periodic and positioned to provide the same within array feature pitch P that is between the TSVs 216, there is no requirement for warpage control features 215 to be in periodic arrays, or have a within array feature pitch that matches the pitch of the TSVs (e.g., pitch in a TSV array, such as 40 μm). In one embodiment the warpage control features 215 are in periodic arrays having a within array feature pitch that is in a range between that of the TSVs 216 and 200 μm. In another embodiment, the warpage control features 215 are in one single array that surrounds the TSV arrays, that can also have a within array feature pitch that is in a range between that of the TSVs 216 and 200 μm.

TSV die 200 comprises a substrate 205 including a topside semiconductor surface 207 including active circuitry 209 and a bottomside surface 210. The active circuitry 209 on TSV die 200 is configured to provide an IC circuit function, such as a logic function, for example. The connector 208 shown depicts the coupling between the TSV 216 on the topside semiconductor surface 207 to the active circuitry 209. The connection to active circuitry 209 is optional, since the connection may simply pass through substrate 205 without connecting to active circuitry 209. The TSV 216 comprises an outer dielectric sleeve 221 and an inner metal core 220, and a TSV barrier layer 222 between the outer dielectric sleeve 221 and an inner metal core 220. The TSV 216 extends from the topside semiconductor surface 207 to protruding TSV tip 217 emerging from the bottomside surface 210. The TSV tip includes sidewalls having outer dielectric sleeve 221 and barrier layer 222 thereon.

As described above, the protruding warpage control features 215 can comprise a dielectric, semiconductor, a metal, or any combination of these (e.g., a multi-layer feature). The height of the protruding warpage control features 215 shown in FIG. 2A matches the height of the metal cap 240, such as being within 1 μm in height. However, the height of the warpage control feature 215 can be selected so that the top of the protruding warpage control features is more generally within ±4 μm of the top of the metal caps 240.

A dielectric passivation layer 231 is shown on the bottomside surface 210 lateral to the protruding TSV tip 217 including on a portion the sidewalls of the protruding TSV tip 217. The passivation layer 231 is absent from the tip end 217(a) to provide an exposed portion of the inner metal core 220. As noted above, the dielectric passivation layer 231 is at least 1 micron thick to a thickness equal to the height of the TSV tips—1 μm. For example, in one particular embodiment the TSV tips 217 extend out about 5 μm from the bottomside surface 210 and the dielectric passivation layer 231 thickness is in the range from 1 to 4 μm thick.

Metal caps 240 are shown comprising a first metal layer 241 that includes a first metal that is generally other than solder that covers the exposed portion the tip end 217(a). A second metal layer 242 including a second metal that is different from the first metal is on the first metal layer 241. It can be seen that the first metal layer 241 together with the second metal layer 242 provides a metal cap 240 for the protruding TSV tip 217 that covers a portion of the TSV sidewalls and a topmost surface 221(a) of the outer dielectric sleeve 221, and provides a cross sectional area that is significantly more as compared to a cross sectional area of the protruding TSV tip 217 below the tip end 217(a). Although the mushroom shape of the metal cap 240 shown in FIG. 2A is characteristic of an electroless plating process, as described above the metal cap may be formed by other processes, including electroplating.

Figure 2B:
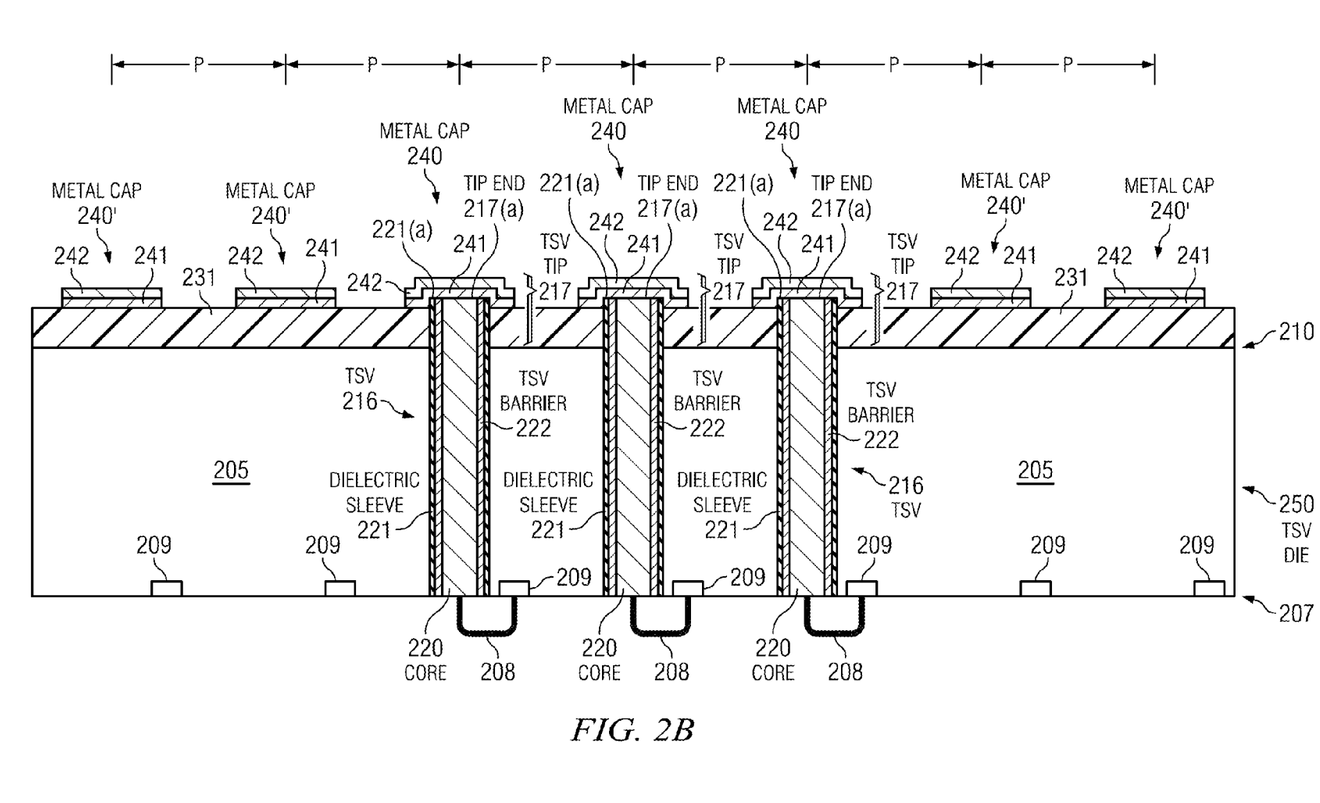
FIG. 2B is a simplified cross sectional depiction of a TSV die comprising a plurality of TSVs that includes a protruding TSV tip having a metal cap on the distal tip end, and protruding warpage control features that includes the layers in the metal cap lateral to the TSV tips, according to an example embodiment.

FIG. 2B is a simplified cross sectional depiction of a TSV die 250 comprising a plurality of TSVs 216 that include protruding TSV tips 217 having a metal cap 240 on the distal tip end 217(a), and warpage control features shown as metal caps 240' lateral to the TSV tip 217, according to an example embodiment. The shape of the metal caps 240 and 240' is characteristic of a non-electroless deposition process such as electroplating. Metal caps 240 and metal caps 240' only differ based on their structure thereunder, with the metal caps 240 being over the TSV tips 217, and the metal caps 240' being over dielectric passivation layer 231 lateral to TSV tips 217.

Figure 3A:
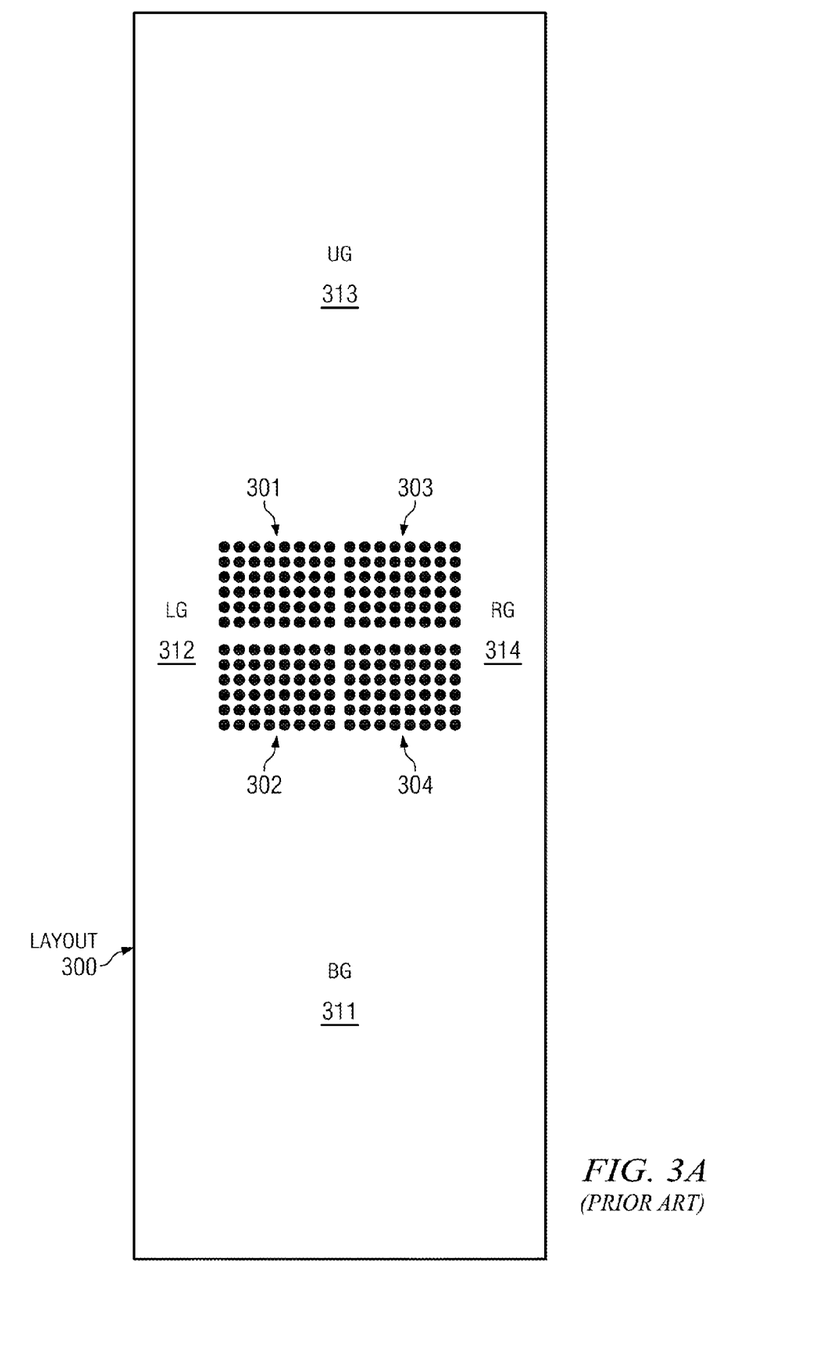
Figure 3B:
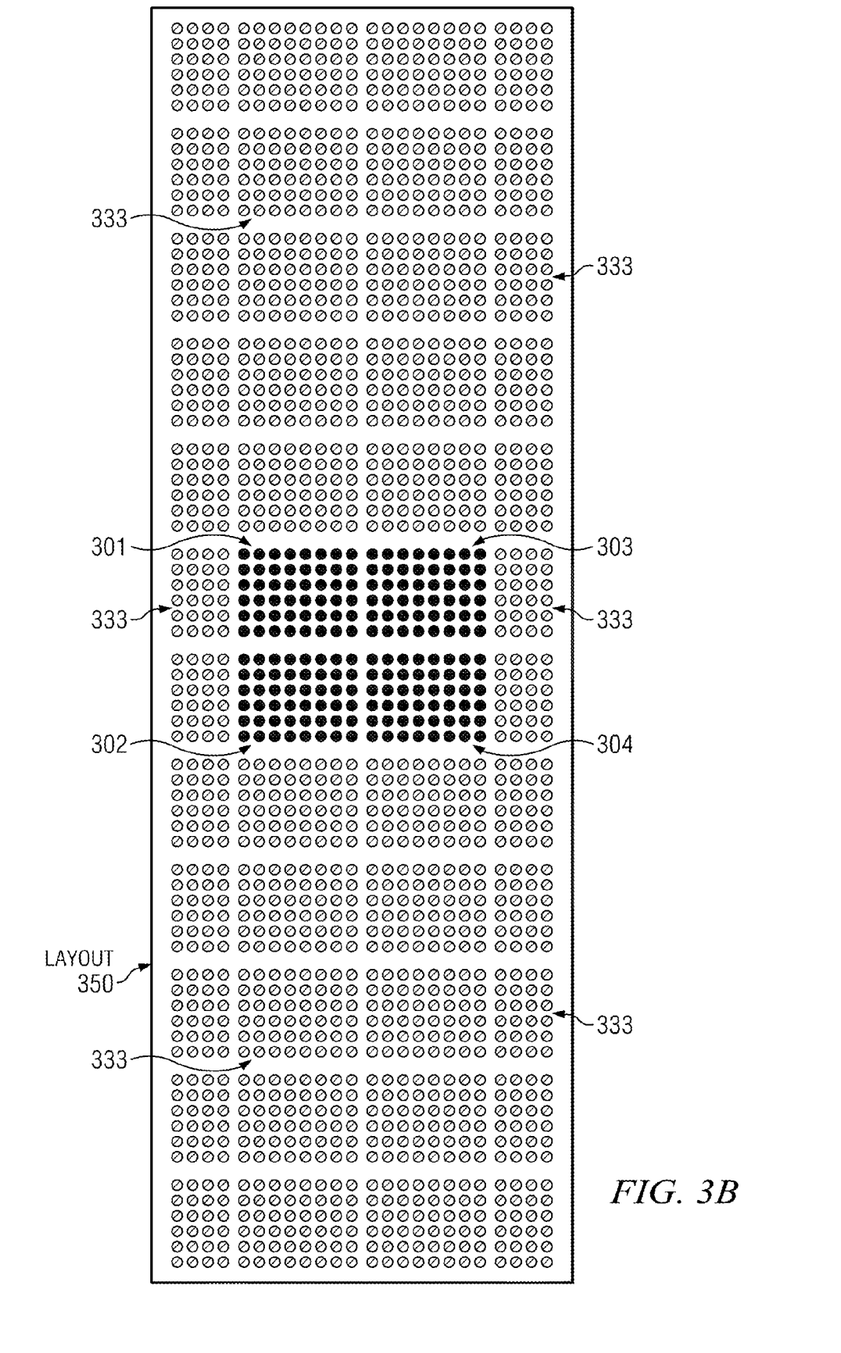
FIG. 3B shows features on an example mask layout for a TSV die for a metal cap mask that includes both the metal features positioned over the TSV tips shown in FIG. 3A, and metal features lateral to the TSV tips in the gap regions that provide disclosed protruding warpage control features.

FIG. 3A shows features on an example mask layout 300 for a TSV die for a conventional metal cap mask that positions metal caps over TSV tips, while FIG. 3B shows features on an example mask layout 350 for a TSV die for a metal cap mask that includes both metal features positioned over the TSV tips shown in FIG. 3A and additional metal features lateral to the TSV tips in the gap regions that provide disclosed warpage control features. Mask layout 300 is shown including features arrays 301-304 corresponding to four (4) TSV arrays, with each feature array including 48 metal caps. Most of the area of the mask 300 is seen to lack TSV features, that defines gap regions. Mask 300 includes bottom gap (BG) region 311, left gap (LG) region 312, upper gap (UG) region 313, and right gap (RG) region 314, where the respective gap regions correspond to areas on the TSV die that lack TSVs and their associated TSV tips.

Mask layout 350 is shown including feature arrays 301-304 shown in FIG. 3A, along with a plurality of disclosed warpage control features in feature arrays 333 lateral to feature arrays 301-304 that fill the gap regions 311-314 in FIG. 3A with disclosed warpage control features in arrays 333 on all sides of feature arrays 301-304. In another embodiment, there is only a single large warpage control feature array that surrounds the feature arrays 301-304. Moreover, as noted above, although the plurality of warpage control features are shown arranged into a plurality of periodic warpage control feature arrays 333 in mask layout 350, there is no requirement for warpage control features to be in periodic arrays. In addition, although the plurality of warpage control features in feature arrays 333 are shown having a within array pitch that matches a within array feature pitch in the feature arrays 301-304, there is no requirement for warpage control features in the warpage control feature array(s) to have the same within array pitch as that of the TSVs within feature arrays 301-304. More generally, the within array period in the warpage control feature arrays 333 can be in a range between a within array pitch in arrays 301-304 and 200 μm.

Figure 4:
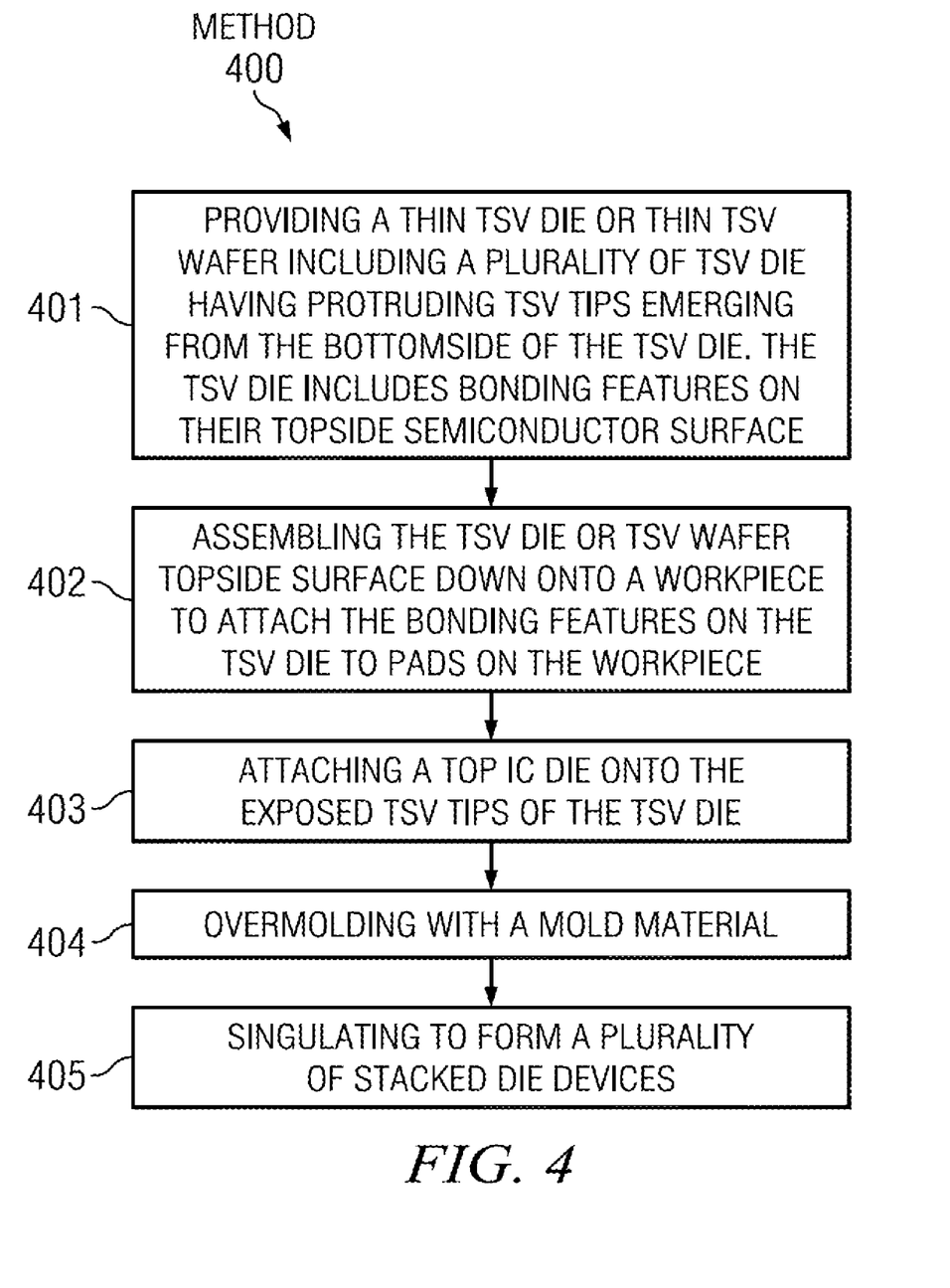
FIG. 4 is a flow chart that shows steps in an example assembly method to form a stacked die device including TC bonding a TSV die or a TSV wafer comprising a plurality of TSV die having protruding TSV tips with metal caps comprising at least one metal layer thereon and protruding warpage controlling features lateral to the protruding TSV tips on the bottomside of the TSV die to a workpiece, according to an example embodiment.

FIG. 4 is a flow chart that shows steps in an example assembly method 400 to form a stacked die device including TC bonding a TSV die or a TSV wafer comprising a plurality of TSV die having protruding TSV tips with metal caps comprising at least one metal layer thereon and protruding warpage controlling features lateral to the protruding TSV tips on the bottomside of the TSV die to a workpiece, according to an example embodiment. Step 401 comprises providing a thin TSV die or thin TSV wafer (e.g., a thickness of 25 to 100 μm) including a plurality of TSV die having protruding TSV tips emerging from the bottomside of the TSV die. The TSV die includes bonding features on their topside, such as pillars or bumps.

As described above, the disclosed warpage control features on the TSV die in gap regions that lack TSV tips provide a more uniform contact of the bond head to the bottomside of TSV die or TSV wafers, which enable more uniform pressure to be applied across the area of the TSV die or wafer during the TC bonding. More uniform pressure helps reduce warpage of the TSV die or TSV wafer due to applied pressure and temperature during TC bonding. Also, the presence of the additional warpage features lowers the effective force per TSV tip during the TC bonding process, reducing or eliminating mechanical damage to the tips that could impact bond integrity during subsequent bonding of a workpiece to the bottomside of the TSV die.

Step 402 comprises assembling the TSV die or TSV wafer topside down onto a workpiece such as package substrate or die to attach the pillars or bumps on the TSV die to pads on the package substrate or the die. The package substrate can comprise a ceramic or an organic substrate, that may be thin (e.g., <350 μm). The package substrate is generally provided as a substrate panel. The assembling can comprise TC bonding.

Step 403 comprises attaching a top IC die onto the exposed TSV tips of the TSV die. In one embodiment the top IC die comprises a memory die, and the TSV die comprises a logic die. In another embodiment the top die comprises an IC die stack comprising a plurality of stacked IC die that are bonded to one another. As described above, the reduced warpage of the TSV die following TC bonding in step 402 provided inclusion of disclosed warpage control features can also reduce failures with top die assembly onto the protruding TSV tips due to loss of coplanarity. Step 404 can comprise overmolding, and step 405 comprises singulation to form a plurality of stacked die devices. When the workpiece comprises a package substrate, method 400 further comprises attaching ball grid array (BGA) solder balls to the bottom of the workpiece before singulation.

Figure 5:
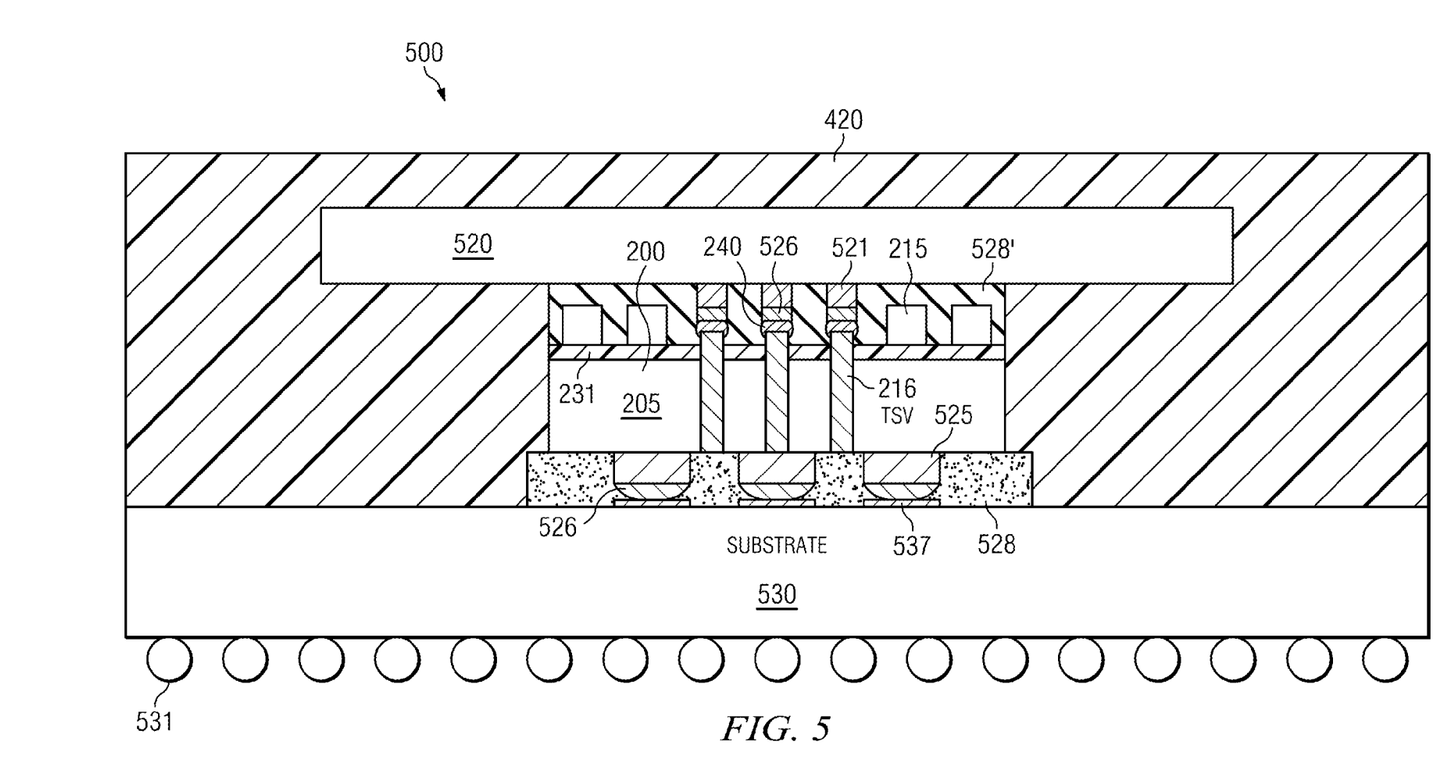
FIG. 5 shows an exemplary stacked die assembly, according to an example embodiment.

FIG. 5 shows an exemplary stacked die assembly 500, according to a disclosed embodiment. Stacked die assembly 500 includes top die 520 that includes pads 521 that are bonded to bottomside of TSV die 200 that includes disclosed warpage control features 215, that is bonded topside down to pads 537 on a workpiece 530 that is shown as a package substrate (e.g., organic substrate). The TSV die is shown including pillars 525 that are capped with solder 526. As noted above, top die 520 can comprise a die stack. Solder 526, introduced from top die 520, is also present (which may be a different solder composition) between the TSV caps 240 and pads 521. Mold material 420 is shown encapsulating the stacked die assembly 500. Underfill between TSV die 200 and workpiece 230 is shown as 528, while underfill between TSV die 200 and top die 520 is shown as 528' indicating the possibility for different underfill compositions. The package substrate 530 is shown including a BGA comprising a plurality of solder balls 531.

The active circuitry formed on the wafer semiconductor substrate comprises circuit elements that may generally include transistors, diodes, capacitors, and resistors, as well as signal lines and other electrical conductors that interconnect the various circuit elements to provide an IC circuit function. As used herein "provide an IC circuit function" refers to circuit functions from ICs, that for example may include an application specific integrated circuit (ASIC), a digital signal processor, a radio frequency chip, a memory, a microcontroller and a system-on-a-chip or a combination thereof. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A through substrate via (TSV) die, comprising:
    a substrate including a top side semiconductor surface having active circuitry and a bottom side surface, wherein said top side semiconductor surface includes a plurality of bonding features thereon;
    a plurality of TSVs comprising an inner metal core that extend from said top side semiconductor surface to protruding TSV tips that extend out from said bottom side surface, and a metal cap on said protruding TSV tips comprising at least one metal layer that includes a metal that is not in said inner metal core, and
    a dielectric passivation layer on said bottom side surface lateral to said protruding TSV tips, and
    a plurality of protruding warpage control features on said bottom side surface lateral to said protruding TSV tips, wherein said plurality of protruding warpage control features do not have said protruding TSV tips thereunder;
    wherein said plurality of protruding warpage control features are electrically isolated from said substrate by said dielectric passivation layer.

2. The TSV die of claim 1, wherein said dielectric passivation layer is at least 1 μm thick.

3. The TSV die of claim 2, wherein a length of said protruding TSV tips measured from said bottom side surface is from 5 to 15 μm, and a top surface of said metal caps on said protruding TSV tips is no more than 4 μm above a height of a top surface of said plurality of protruding warpage control features.

4. The TSV die of claim 1, wherein said plurality of protruding warpage control features comprise said metal layer.

5. The TSV die of claim 1, wherein said inner metal core comprises copper and said metal layer comprises at least one of titanium, nickel, palladium, and gold.

6. The TSV die of claim 1, wherein said plurality of protruding warpage control features are arranged into a plurality of warpage control feature arrays, and wherein said plurality of protruding warpage control feature arrays comprise periodic arrays.

7. The TSV die of claim 6, wherein said periodic arrays have a within array feature pitch in a range between a within array pitch for said plurality of TSVs and 200 μm.

8. A stacked die assembly, comprising
    a package substrate having a top surface and a bottom surface opposite to said top surface, wherein said top surface includes a plurality of bonding features;
    a TSV die comprising a substrate including a top side semiconductor surface having active circuitry and a bottom side surface and a plurality of through substrate vias (TSVs) with said topside bonded onto said top surface of said package substrate, wherein said plurality of TSVs comprise an inner metal core that extends from said topside semiconductor surface to protruding TSV tips that extend out from said bottom side surface, and a metal cap on said protruding TSV tips comprising at least one metal layer that includes a metal that is not in said inner metal core, and a dielectric passivation layer on said bottom side surface lateral to said protruding TSV tips, wherein said TSV die includes a plurality of protruding warpage control features on said bottom side surface lateral to said protruding TSV tips, and wherein said plurality of protruding warpage control features do not have said protruding TSV tips thereunder, and wherein said plurality of protruding warpage control features are electrically isolated from said substrate by said dielectric passivation layer, and
    a top IC die bonded to said protruding TSV tips of said TSV die.

9. The stacked die assembly of claim 8, wherein said dielectric passivation layer is at least 1 μm thick.

10. The stacked die assembly of claim 8, wherein said plurality of protruding warpage control features are arranged into a plurality of warpage control feature arrays, and wherein said plurality of protruding warpage control feature arrays comprise periodic arrays.

11. The stacked die assembly of claim 10, wherein said periodic arrays have a within array feature pitch in a range between a within array pitch for said plurality of TSVs and 200 μm.

* * * * *